(12) United States Patent
Uetake

(10) Patent No.: US 7,852,702 B2
(45) Date of Patent: Dec. 14, 2010

(54) SEMICONDUCTOR MEMORY DEVICE

(75) Inventor: Toshiyuki Uetake, Kawasaki (JP)

(73) Assignee: Fujitsu Semiconductor Limited, Yokohama (JP)

(\*) Notice: Subject to any disclaimer, the term of this patent is extended or adjusted under 35 U.S.C. 154(b) by 0 days.

(21) Appl. No.: 11/785,806

(22) Filed: Apr. 20, 2007

(65) Prior Publication Data

US 2008/0056055 A1    Mar. 6, 2008

(30) Foreign Application Priority Data

Sep. 5, 2006    (JP) .............................. 2006-240340

(51) Int. Cl.
*G11C 8/00*    (2006.01)
*G11C 7/00*    (2006.01)

(52) U.S. Cl. .......................... 365/230.06; 365/189.09; 365/233.1

(58) Field of Classification Search ............ 365/230.06, 365/226, 185.23, 203, 233.1, 189.09
See application file for complete search history.

(56) References Cited

U.S. PATENT DOCUMENTS

| | | | | |
|---|---|---|---|---|
| 5,282,171 A * | 1/1994 | Tokami et al. | ......... | 365/230.06 |
| 5,289,417 A * | 2/1994 | Ooishi et al. | ........... | 365/230.06 |
| 5,394,373 A * | 2/1995 | Kawamoto | ............. | 365/230.06 |
| 5,490,119 A * | 2/1996 | Sakurai et al. | ......... | 365/230.06 |
| 5,617,369 A * | 4/1997 | Tomishima et al. | .... | 365/230.06 |
| 5,631,869 A * | 5/1997 | Ninomiya et al. | ...... | 365/230.06 |
| 5,687,123 A * | 11/1997 | Hidaka et al. | .......... | 365/230.06 |
| 5,706,233 A * | 1/1998 | Ooishi | .................... | 365/230.06 |
| 5,706,245 A * | 1/1998 | Kim | ...................... | 365/230.06 |
| 5,734,614 A * | 3/1998 | Tsuruda et al. | ........ | 365/230.06 |
| 5,737,275 A * | 4/1998 | Matthews et al. | ...... | 365/230.06 |
| 5,740,115 A * | 4/1998 | Ishibashi et al. | ....... | 365/230.06 |
| 5,841,716 A * | 11/1998 | Iwaki | ......................... | 365/203 |
| 5,894,442 A * | 4/1999 | Okamura | .................... | 365/203 |
| 5,896,343 A * | 4/1999 | Furumochi | ............. | 365/230.06 |
| 5,970,016 A * | 10/1999 | Ohsawa | ................. | 365/230.06 |
| 6,031,781 A * | 2/2000 | Tsuji et al. | ............. | 365/230.06 |
| 6,233,198 B1 * | 5/2001 | Choi | ..................... | 365/230.06 |
| 6,487,138 B2 * | 11/2002 | Origasa | ................. | 365/230.06 |
| 6,909,627 B2 * | 6/2005 | Chen | .......................... | 365/203 |
| 6,920,079 B2 * | 7/2005 | Shibayama | ............ | 365/230.06 |
| 7,082,050 B2 * | 7/2006 | Theel | .......................... | 365/203 |
| 7,385,841 B2 * | 6/2008 | Houston | ................ | 365/230.06 |
| 7,423,909 B2 * | 9/2008 | Shinozaki et al. | ...... | 365/185.23 |
| 7,430,149 B2 * | 9/2008 | Yoshinaga et al. | .......... | 365/226 |

FOREIGN PATENT DOCUMENTS

JP    62-150588 A    7/1987
JP    07-211075 A    8/1995

\* cited by examiner

*Primary Examiner*—Trong Phan
(74) *Attorney, Agent, or Firm*—Arent Fox, LLP

(57) ABSTRACT

A semiconductor memory device includes memory cells, word lines connected to the memory cells, word driver circuits for driving the word lines, a decoder circuit group including a plurality of decoder circuits outputting a decoder signal for selecting at least one of the word driver circuits, decoder lines connecting the decoder circuits to the word driver circuits, and an equalizing circuit for electrically disconnecting the decoder lines from the decoder circuits and equalizing the voltages of the decoder lines connected to the decoder circuits belonging to the decoder circuit group.

11 Claims, 5 Drawing Sheets

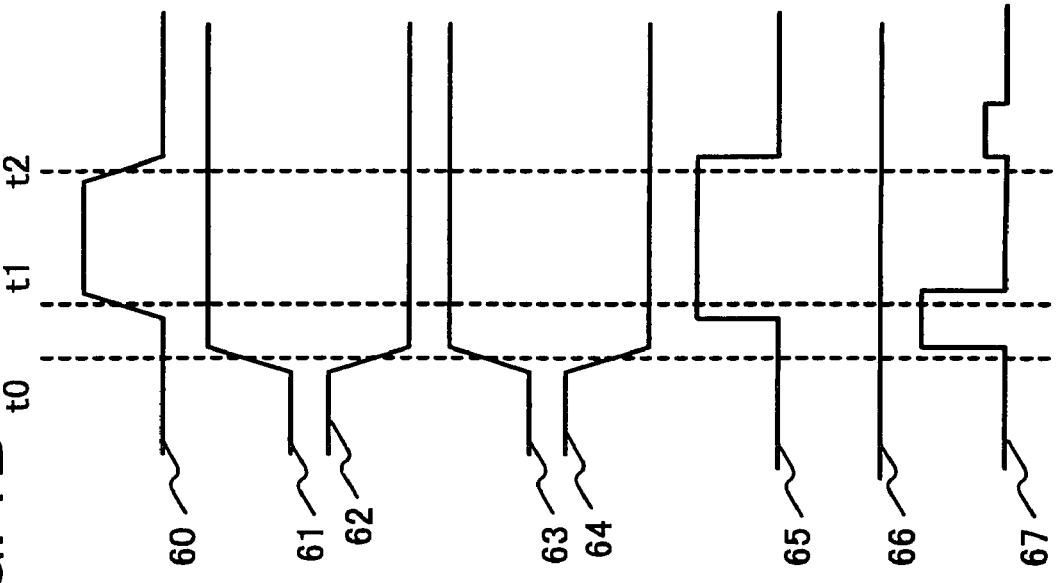
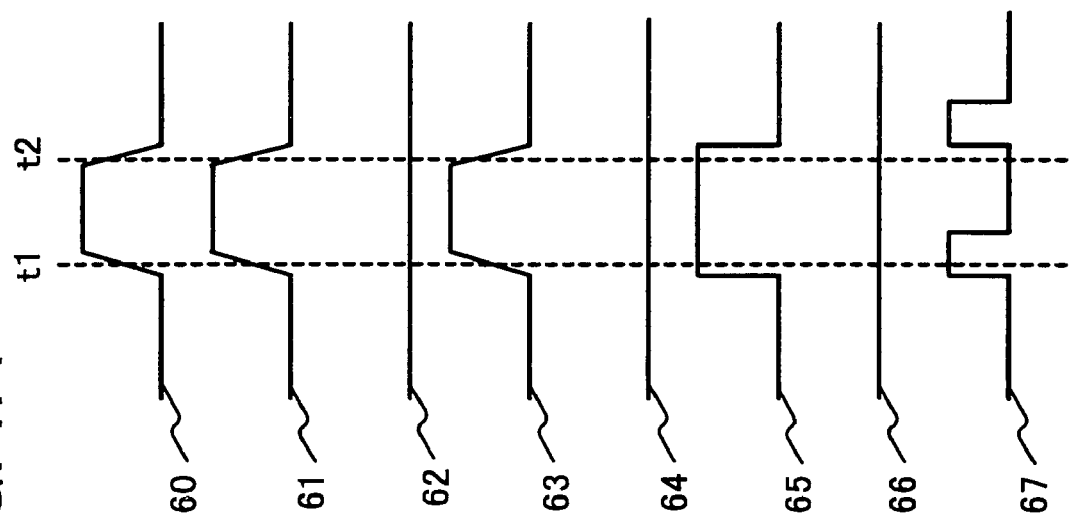

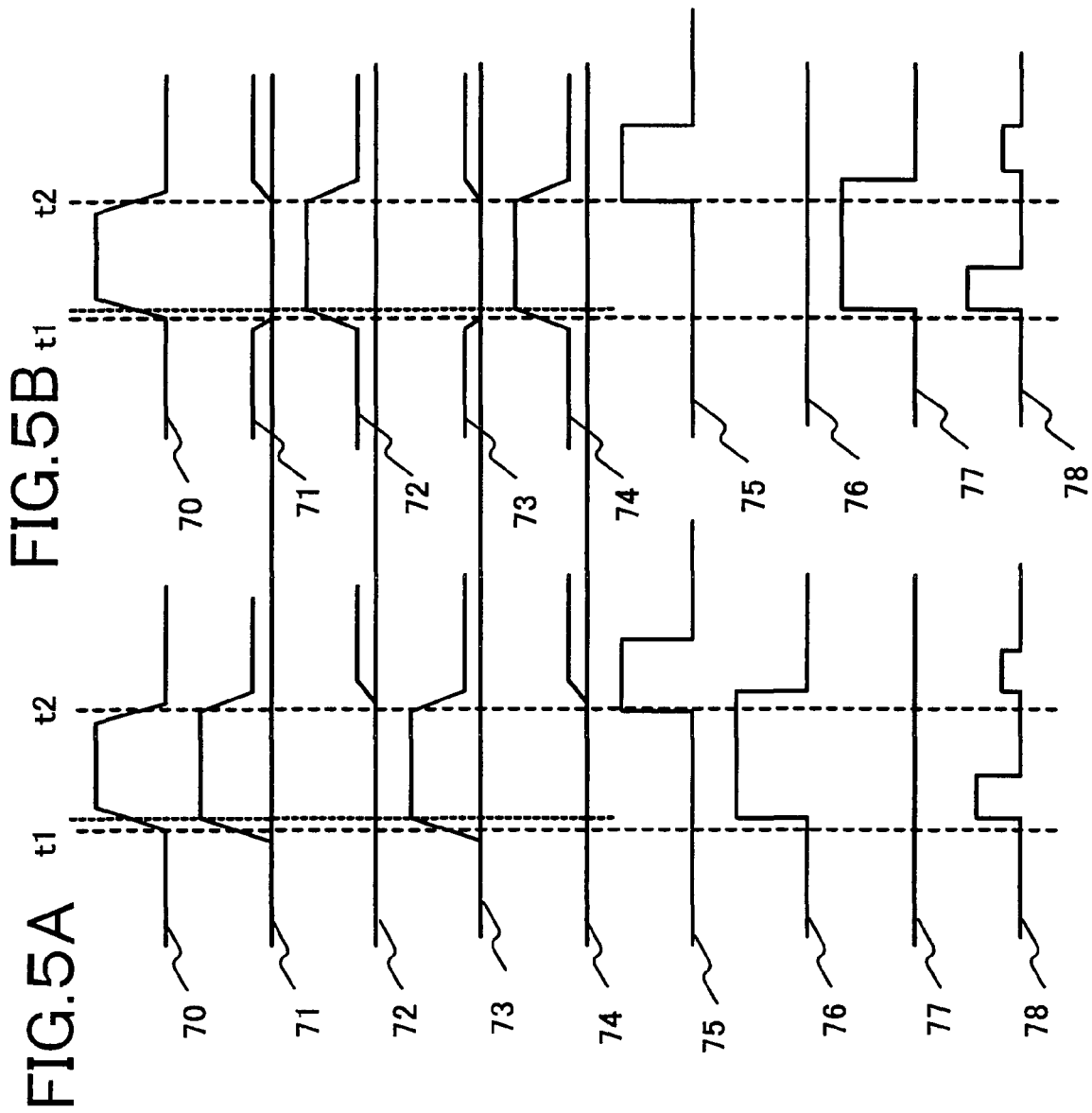

SEMICONDUCTOR MEMORY DEVICE

BACKGROUND OF THE INVENTION

1. Field of the Invention

The present invention relates to semiconductor memory devices, and particularly to a semiconductor memory device provided with a semiconductor memory unit having memory elements integrated therein and a decoder circuit for selecting the memory elements.

2. Description of the Related Art

Decoder circuits for selecting memory elements in semiconductor memory devices receive address lines or predecode lines transmitting signals represented by combination of addresses and select word lines connected to the memory elements. Therefore, an increase in the operating speed of a decoder circuit will result in an increase in the operating speed of a semiconductor memory device.

However, in a decoder circuit receiving pulse signals, which are suitable for increasing operating speed, it is necessary to charge/discharge a signal line for each address cycle (see for example, Japanese Unexamined Patent Application Publication No. H11-102586). Therefore, current consumption in the decoder circuit increases with increasing operating speed.

On the other hand, Japanese Unexamined Patent Application Publication No. H7-73674 describes a decoder circuit which receives a data-type signal having logic states for which charging or discharging is performed only once in a cycle. In such a decoder circuit, setting the logic state of a data signal to a selection state before the logic states of the other data signals fully become non-selection states will cause multiple selection. This results in a decrease in the operating speed of the decoder circuit since it is necessary to control the timing for shifting from the selection state of a data signal to the selection state of another data signal.

Thus, such known techniques described above have disadvantages of an increase in current consumption due to frequent charge/discharge of signal lines and a decrease in the operating speed due to selection operations of word lines.

SUMMARY OF THE INVENTION

Accordingly, a semiconductor memory device according to an embodiment of the present invention includes memory cells, word lines connected to the memory cells, word driver circuits for driving the word lines, a decoder circuit group including a plurality of decoder circuits outputting a decoder signal for selecting at least one of the word driver circuits, decoder lines connecting the decoder circuits to the word driver circuits, and an equalizing circuit for electrically disconnecting the decoder lines from the decoder circuits and equalizing the voltages of the decoder lines connected to the decoder circuits belonging to the decoder circuit group.

According to an embodiment of the present invention, a circuit for equalizing the voltages of the decoder lines is used so that charge is supplied from a decoder line at a high level (H level) to another decoder line. Thus, the voltage of a decode signal at a low level (L level) is increased. Consequently, the logic amplitude of the decode signal, which changes when a word driver circuit is selected, decreases, and thus current consumption in the decoder circuits driving the decoder lines decreases.

BRIEF DESCRIPTION OF THE DRAWINGS

FIGS. 4A and 4B illustrate waveforms of signals transmitted through decoder lines and word lines, when the equalizing and floating circuits illustrated in FIG. 3 are not used; and FIGS. 5A and 5B illustrate waveforms of signals transmitted through decoder lines and word lines, when the equalizing and floating circuits illustrated in FIG. 3 are used.

DESCRIPTION OF THE PREFERRED EMBODIMENTS

In the following, Embodiment 1 of the present invention will be described.

Embodiment 1

Figure 1:
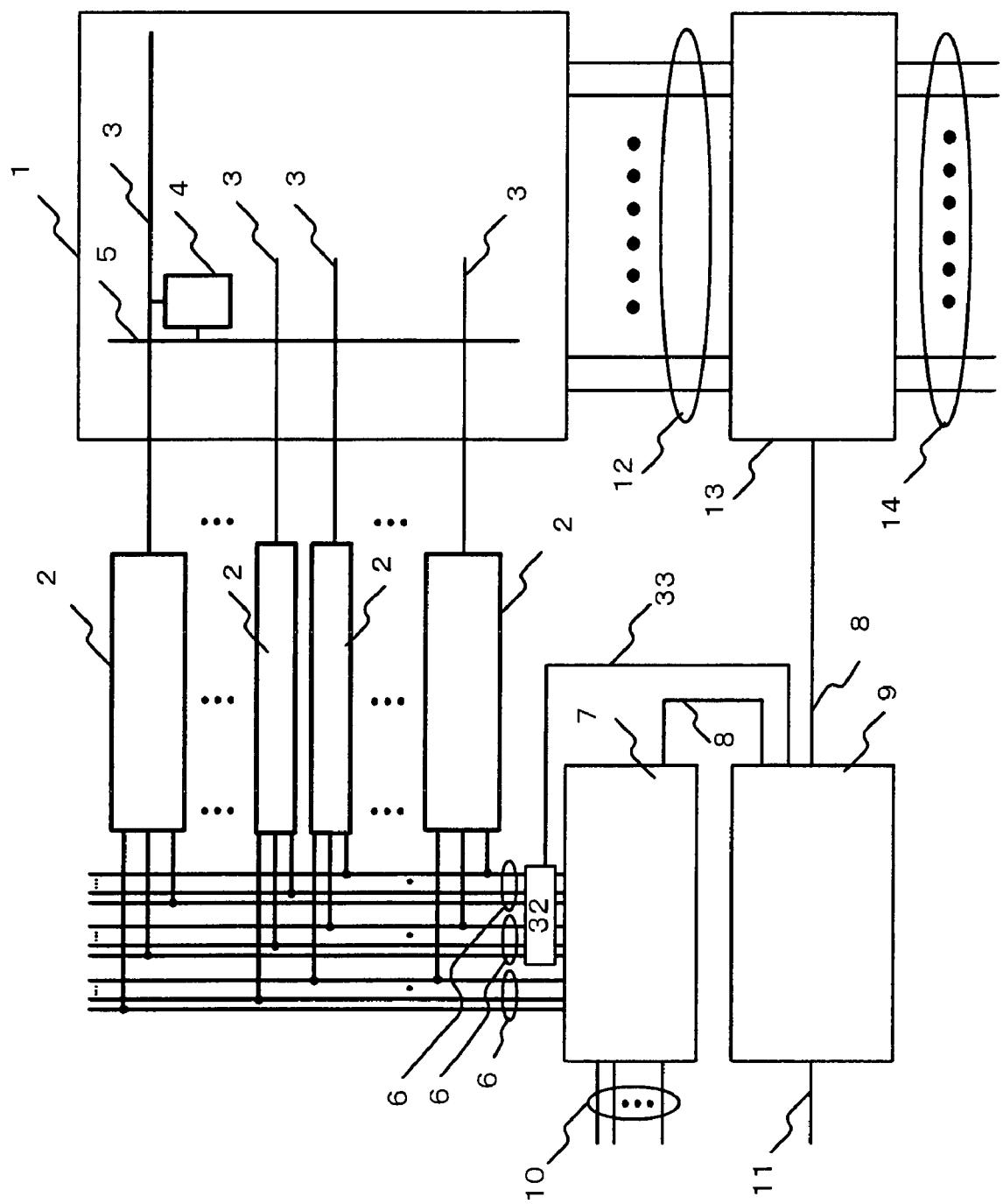
FIG. 1 illustrates a semiconductor memory device according to Embodiment 1.

Referring to FIGS. 1 to 5B, a semiconductor memory device according to the present embodiment will be described. The semiconductor memory device has word driver circuits for driving word lines connected to memory elements and decoder lines for selecting one of the word driver circuits. The semiconductor memory device is further provided with a circuit for equalizing the voltages of decoder lines after setting the decoder lines to a floating state. FIG. 1 illustrates a semiconductor memory device according to Embodiment 1. The semiconductor memory device includes a memory cell array 1, word drivers 2, word lines 3, memory cells 4, a bit line 5, decoder lines 6, a row decoder circuit 7, a control signal 8, a control circuit 9, address signal lines 10, a clock signal 11, data lines 12, an output circuit 13, data output lines 14, and equalizing and floating units 32.

In the memory array 1, the memory cells 4 are arranged in a matrix.

The memory cells 4 are memory elements in a SRAM (Static Random Memory). For example, each of the memory elements is composed of six transistors and stores one-bit information. The memory elements are selected by the word lines 3 and the bit line 5.

Each of the word lines 3 extends in the row direction of the memory cell array 1 and is connected to the individual memory cells 4 arranged in the row direction. Outside the memory cell array 1, the word lines 3 are also connected to the word drivers 2 for driving the word lines 3.

The bit line 5 extends in the column direction of the memory cell array 1 and is connected to the memory cells 4 arranged in the column direction.

Each of the word drivers 2 is connected to decoder lines 6. When a predetermined combination of logic levels of signals transmitted through the decoder lines 6 is obtained, one of the word drivers 2 enters a selection state to activate a corresponding one of the word lines 3.

The row decoder circuit 7 is composed of a plurality of decoder groups each composed of a plurality of decoders. The address signals 10 are input to the row decoder circuit 7. When a predetermined combination of the logic levels of the address signals 10 is obtained, the row decoder circuit 7 activates a predetermined decoder and outputs a signal to a corresponding one of the decoder lines 6 connected to the decoder.

The decoder lines 6 are signal lines each connected to the individual decoders in the decoder groups that constitute the row decoder circuit 7.

The equalizing and floating unit 32 is supplied with a control signal 8 to set the decoder lines 6 to a floating state with respect to the decoders and equalize the decoder lines 6 that belong to the same decoder group. Using FIG. 3, this equalizing and floating unit 32 will be described in detail below.

The address signals 10 include a plurality of addresses input through an external terminal of the semiconductor memory device. These addresses serve to designate the memory cells 7 from which data is desired to be retrieved. The control circuit 9 is supplied with a clock signal 11 and outputs a control signal 8.

The clock signal 11 is a synchronizing signal necessary for operating the semiconductor memory device according to Embodiment 1.

The control signal 8 is synchronized with the clock signal 11. The control signal 8 is output to the row decoder circuit 7, the equalizing and floating unit 32, and the output circuit 13. The control signal 8 thus serves as a control signal for controlling signal output from the row decoder circuit 7 to the decoder lines 6. Further, the control signal 8 serves as a control signal for controlling data output of the output circuit 13 from the data output line 8. In addition, the control signal 8 serves as an equalizing signal 33 for operating the equalizing and floating unit 32.

The data lines 12 are signal lines for transmitting data read from the memory cells 4 of the memory cell array 1 to the output circuit 13.

The output circuit 13 serves to output data transmitted from the data lines 12 from the data output lines 14 in synchronization with the control signal 8.

The data output lines 14 are connected to the output circuit 13 and an external terminal so as to output data to the outside of the semiconductor memory device.

Figure 2:
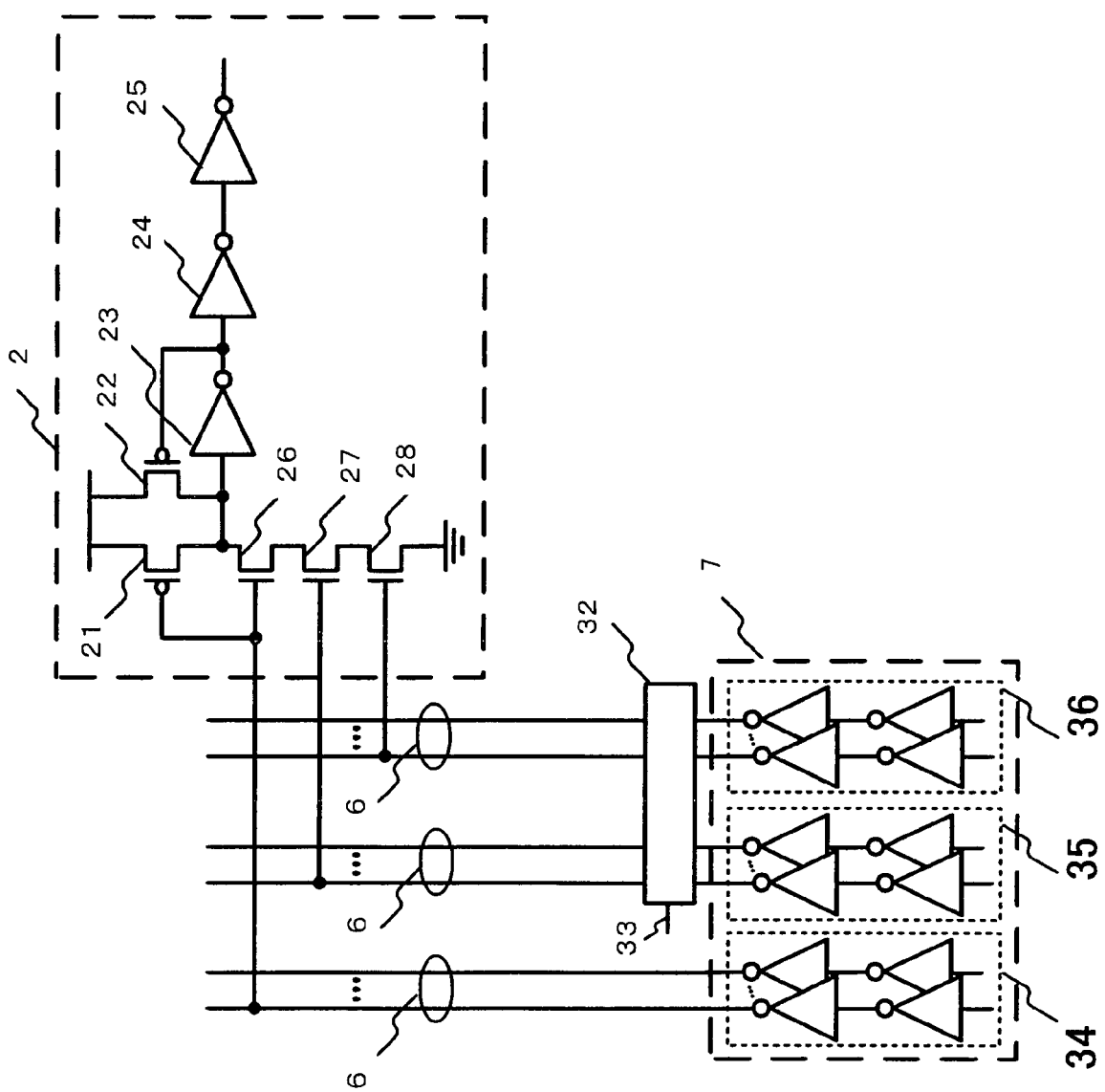
FIG. 2 illustrates a row decoder circuit and a word driver of a semiconductor memory device according to Embodiment 1.

FIG. 2 illustrates in detail the row decoder circuit 7 and the word driver 2 of the semiconductor memory device according to Embodiment 1. As shown in the figure, the word driver 2 includes P-type MOS (metal oxide semiconductor) transistors 21 and 22, inverters 23, 24, and 25, and N-type MOS transistors 26, 27, and 28. FIG. 2 also illustrates the decoder lines, the equalizing and floating unit 32, the equalizing signal 33, the row decoder circuit 7, and the decoder groups 34, 35, and 36.

Each of the word drivers 2 includes an activation signal output unit which is connected to the decoder lines 6 and outputs an activation signal for activating_corresponding one of the word lines 3 and a signal holding unit for holding an activation signal from the activation signal output unit.

A decoding unit includes the P-type MOS transistor 21 and the N-type MOS transistors 26, 27, and 28, which are connected in series between a high-potential source and a low-potential source. The P-type MOS transistor 21 and the N-type MOS transistor 26 share a signal line connected to their gates. This signal line is connected to the decoder line 6 output from the decoder group 34 of the row decoder circuit 7. Signal lines connected to the gates of the individual N-type MOS transistor 27 and the N-type MOS transistor 28 are connected to the corresponding decoder lines 6. Thus, each of the individual gates of the N-type MOS transistors 27 and 28 is connected to one of the decoder lines 6 connected to the decoder groups 35 and 36, respectively.

The signal holding unit includes the P-type MOS transistor 22 which holds a signal output from the P-type MOS transistor 21 and the N-type MOS transistor 26 of the decoding unit, and the inverters 23, 24, and 25.

The row decoder circuit 7 includes a plurality of decoder groups 34, 35, and 36, as mentioned above. Each of these decoder groups 34, 35, and 36 is composed of, for example, N decoders. The decoders are connected to the individual decoder lines 6.

When an address is input from the address signal lines 10 to the row decoder circuit 7, one decoder among the plurality of decoders in each of the decoder groups is activated and a signal is output to a corresponding one of the decoder lines 6 that is connected to the activated decoder.

Note that a signal to be output from the decoder group 34 is a pulse signal. In addition, a signal output from the decoder group 35 or 36 is a pulse signal or a data-type signal.

Figure 3:
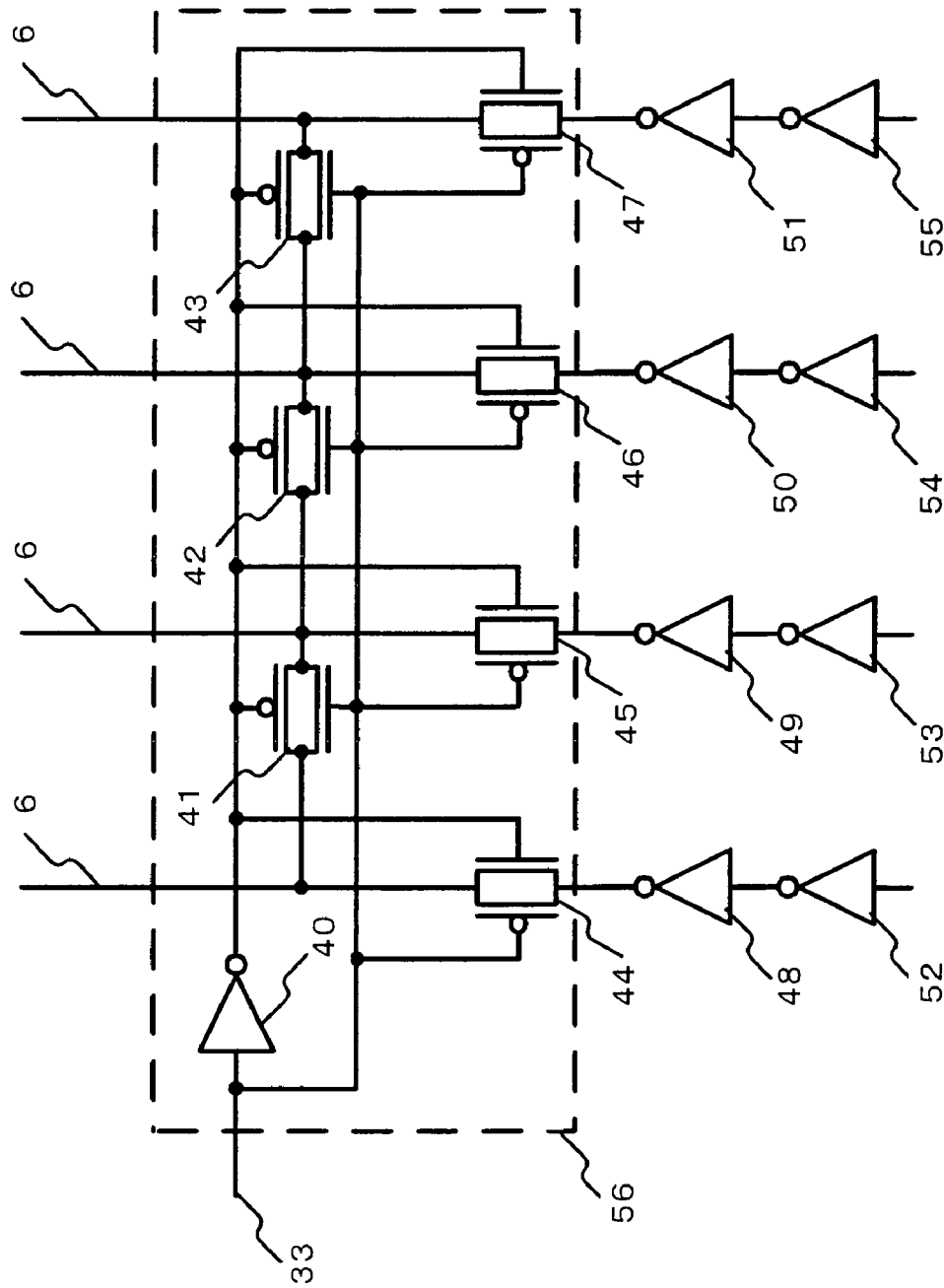
FIG. 3 illustrates equalizing and floating circuits connected to a decoder group of a row decoder circuit.

The equalizing and floating unit 32 receives the equalizing signal 33 and sets the decoder lines 6 to the floating state with respect to the decoders. The equalizing and floating unit 32 then equalizes the voltages of decoder lines 6 which belong to the same decoder group. Referring to FIG. 3, the equalizing and floating unit 32 will be described in detail. FIG. 3 illustrates equalizing and floating circuits 56 connected to the decoder group 35 of the row decoder circuit 7. FIG. 3 illustrates the decoder lines 6, the equalizing and floating circuits 56 connected to the decoder group 35 of the row decoder circuit 7, the equalizing signal 33, transfer gates 41, 42, 43, 44, 45, 46, and 47, and inverters 40, 48, 49, 50, 51, 52, 53, 54, and 55.

As can be seen from the figure, the equalizing and floating circuits 56 corresponding to the decoder group 35 having four decoders are arranged between the row decoder circuit 7 and the decoder lines 6.

An equalizing circuit which constitutes the equalizing and floating circuits 56 is composed of the transfer gates 41, 42, and 43 and the inverter 40. When receiving the equalizing signal 33, the equalizing circuit causes the transfer gates 41, 42, and 43 to be conductive. The equalizing circuit then short-circuits the decoder lines 6 which belong to the same decoder group of the row decoder circuit 7 and equalizes the voltages of the decoder lines 6. Each of the transfer gates 41, 42, and 43 is constituted by a P-type MOS transistor and an N-type MOS transistor which are connected in parallel. Each of the gates of the N-type MOS transistors of the transfer gates 41, 42, and 43 is supplied with the equalizing signal 33. On the other hand, each of the gates of the P-type MOS transistors of the transfer gates 41, 42, and 43 is supplied with an inverted logic signal of the equalizing signal 33.

In the foregoing, the transfer gates are used to electrically connect the decoder lines 6 with each other. However, switches may also be used which are turned on when the equalizing signal 33 becomes the H level.

A floating circuit, which constitutes the equalizing and floating circuits 56, is composed of the transfer gates 44, 45, 46, and 47, and the inverter 40. When the floating circuit receives the equalizing signal 33, the transfer gates 41, 42, and 43 become non-conductive. The floating circuit electrically disconnects the decoder lines 6 connected to the corresponding decoder and sets the decoder lines 6 to the floating state.

Each of the transfer gates 44, 45, 46, and 47 is constituted by a P-type MOS transistor and an N-type MOS transistor which are connected in parallel. Each of the gates of the P-type MOS transistors of the transfer gates 44, 45, 46, and 47 is supplied with the equalizing signal 33. On the other hand, each of the gates of the N-type MOS transistors of the transfer gates 44, 45, 46, and 43 is supplied with an inverted logic signal of the equalizing signal 33.

In the foregoing, the transfer gates are used to electrically connect the decoder lines 6 with each other. However, switches may also be used which are turned on when the equalizing signal 33 becomes the L level.

The inverters 48 to 55 constitute the decoder group 35 for driving the decoder lines 6.

FIGS. 4A and 4B illustrate waveforms of signals to be transmitted through the decoder lines 6 and the word lines 3 when the equalizing and floating circuits 56 illustrated in FIG. 3 are not used. FIGS. 4A and 4B also illustrate consumption current for the illustrated waveforms.

The figures illustrate a signal 60 of a 0th decoder line of a decoder group P0, a signal 61 of a 0th decoder line of a decoder group P1, a signal 62 of a 1st decoder line of the decoder group P1, a signal 63 of a 0th decoder line of a decoder group P2, and a signal 64 of a 1st decoder line of the decoder group P2. The figures also illustrate a 0th word line 65, a 1st word line 66, and consumption current 67. FIG. 4A indicates that signals output from the decoder groups are all pulse signals. Specifically, at a time point t1, the logic levels of the signal 60 of the 0th decoder line of the decoder group P0, the signal 61 of the 0th decoder line of the decoder group P1, and the signal 63 of the 0th decoder line of the decoder group P2 change from ground levels to H levels. At a time point t2, the logic levels of these signals change from the H levels to the ground levels. This indicated that, each of the word drivers 2 generates a pulse signal whose logic level changes from the ground level to the H level at the time point t1 and changes from the H level to the ground level at the time point t2.

The ground level is recognized as a logic "L", and the potential of the ground level refers to the ground potential. On the other hand, an L level described below is recognized as a logic "L". However, the potential of the L level refers to a potential obtained by dividing the potential at the high-potential source by the number N of decoder lines. Further, an H level is recognized as a logic "H", and the potential of the H level refers to the potential at the high-potential source.

When all of the signals of the decoder lines described above are pulse signals, the word line of the word driver 2 is activated only when the pulses are superimposed. Thus, it is not necessary to obtain a margin between the signals of the decoder lines as long as the pulse widths of the signals are obtained. Accordingly, when the signals of the decoder lines are all pulse signals, a cycle of activating the word lines can be shortened, and thus an increase in the operating speed of the decoders can be achieved.

In this description, the amount consumption current of the row decoder circuit 7, which is obtained when the signal logic level of a decoder line charges from the H level to the ground level, is assumed to be "1". In this case, as illustrated in FIG. 4A, since the signal levels of the three decoder lines 6 change at the time point 1, the amount of the consumption current 67 in the row decoder circuit 7 is "3". Further, since the signal levels on the three decoder lines 6 change at the time point t2, the amount of the consumption current 67 in the row decoder circuit 7 is "3". Therefore, the amount of the consumption current 67 consumed by the row decoder circuit 7 between the time points t1 and t2 is "6".

FIG. 4B illustrates a case where signals output from the decoder group P0 are pulse signals and signals output from the other decoder groups are data-type signals. As can be seen from the figure, the logic level of the signal 60 of the 0th decoder line of the decoder group P0 changes from the ground level to the H level at the time point t1, and from the H level to the ground level at the time point t2. The signal 60 is a pulse signal. On the other hand, the signal 61 of the 0th decoder line of the decoder group P1 and the signal 63 of the 0th decoder line of the decoder group P2 are data-type signals whose logic levels change from the ground levels to the H levels at a time point t0. Further, the FIG. 4B indicates that the signal 62 of the 1st decoder line of the decoder group P1 and the signal 64 from the 1st decoder line of the decoder group P2 are data-type signal whose logic levels change from the H levels to the ground levels at the time point t0. As a result, the word driver 2 sends the 0th word line 65 a pulse signal whose logic level changes from the ground level to the H level at the time point t1 and from the H level to the ground level at the time point t2.

In the foregoing, the case is described where signals output from the decoder group P0 are pulse signals and signals out put from the decider lines of other decoder groups are data-type signals. In such a case, when a pulse output from the decoder group P0 reaches any the word drivers 2, the logic levels of the signals of the other decoder groups needs to have been determined. Thus, it is necessary to ensure a margin between the signal of the decoder line of the decoder group P0 and the signals of the other decoder lines in order to activate a predetermined word line. Therefore, in this case, it is not easy to shorten a cycle time of activating a word line and thus to realize high speed operations of decoders.

Referring to FIG. 4B, it can be seen that signals of five decoder lines change from the time point t0 to the time point t1. This indicates the amount of the consumption current 67 in the row decoder circuit 7 is "5". In addition, as illustrated in the same figure, a signal of one decoder changes at the time point t2, indicating that the amount of the consumption current 67 in the row decoder circuit 7 is "1". Thus, the amount of the consumption current 67 consumed by the row decoder circuit 7 from the time period t0 to the time period t2 is "6" in total.

FIGS. 5A and 5B illustrates waveforms of signals transmitted through the decoder lines 6 and the word lines 3, which are obtained when the equalizing and floating circuits 56 illustrated in FIG. 3 is used. The figures also illustrate consumption currents for the illustrated waveforms.

FIGS. 5A and 5B illustrates a signal 70 of a 0th decoder line of a decoder group P0, a signal 71 of a 0th decoder line of a decoder group P1, a signal 72 of a 1st decoder line of the decoder group P1, a signal 73 of a 0th decoder line of a decoder group P2, a signal 74 on a 1st decoder line of the decoder group P2, an equalizing signal, 75, a 0th word line 76, a 1st word line 77, and consumption current 78.

FIG. 5A illustrates a case where the 0th word line 76 is selected by the decoder lines of the individual decoder groups.

The equalizing signal 75 has a pulse width of tw and is input at a time point t2.

All signals of the decoder lines of the decoder groups are pulse signals. That is, the signal 70 of the 0th decoder line of the decoder group P0 changes from the ground level to the H level at a time point t1 and from the H level to the ground level at the time point t2. Each of the signal 71 of the 0th decoder line of the decoder group P1 and the signal 73 of the 0th decoder line of the decoder group P2 changes from the ground level to the H level at the time point t1 and from the H level to an L level at the time point t2.

The decoders that belong to the decoder group P0 output pulse signals. On the other hand, the decoders of the decoder P1 and the decoders of the decoder group P2 output data-type signals. However, as mentioned above, signals of the all decoder lines are pulse signals. This is because the equalizing and floating circuits 56 are used after a pulse signal is output from the decoder group P0 to a word driver, and as a result the voltage of the decoder lines of the decoder group P1 and the decoder lines of the decoder group P2 are equalized.

Note that the L level refers to a voltage obtained by dividing a voltage at the H level by N. When the equalize and floating circuits 56 start operating as a result of input of the equalizing signal 75, a floating circuit of the equalizing and floating circuits 56 brings the decoder lines into floating state with respect to the individual decoders. At the same time, the voltages of N decoder lines that belong to the same decoder group are equalized. Charges stored in one of the N decoder lines that belong to the same decoder group, which has been at the voltage of the H level, are shared between the N decoder lines. Thus, all of the individual decoder lines have the voltage obtained by dividing the H level voltage by N.

Consequently, the logic level of the 0th word line 76 selected by the decoder lines of the individual decoder group changes from the ground level to the H level at the time point t1 and from the H level to the ground level at the time point t2. As can be seen from FIG. 5A, signals of three decoder lines change at the time point t1. Thus, the amount of the consumption current 78 consumed by the row decoder circuit 7 at the time point t1 is "3".

On the other hand, FIG. 5A indicates that the amount of the consumption current 78 consumed by the row decoder circuit 7 at the time point t2 is "1". This is because the row decoder circuit 7 consumes current in order to change the logic level of the signal 70 of the 0th decoder line of the decoder group P0 from the H level to the ground level. The logic levels of signals of the decoder lines other than the signal 70 change to the L levels as a result of the equalizing operation. Thus, the row decoder circuit 7 does not consume current for the change.

FIG. 5B illustrates a case where the 1st word line 77 is selected by the decoder lines of the individual decoder groups.

The equalizing signal 75 is similar to the equalizing signal 75 illustrated in FIG. 5A.

Signals of the decoder lines of all decoder groups are pulse signals. That is, the signal 70 of the 0th decoder line of the decoder group P0 changes from the ground level to the H level at the time point t1 and from the H level to the ground level at the time point t2.

The signal 71 of the 0th decoder line of the decoder group P1 changes from the L level to the ground level at the time point t1 and from the ground level to the L level at the time point t2. The signal 72 of the 1st decoder line of the decoder group P1 changes from the L level to the H level at the time point t1 and from the H level to the L level at the time point t2. The signal 73 of the 0th decoder line of the decoder group P2 changes from the L level to the ground level at the time point t1 and from the ground level to the L level at the time point t2. The signal 74 of the 1st decoder line of the decoder group P2 changes from the L level to the H level at the time point t1 and from the H level to the L level at the time point t2.

The decoders that belong to the decoder group P0 output pulse signals. On the other hand, the decoders that belong to the decoder group P1 and the decoder group P2 output data-type signals. However, signals of the decoder lines of all decoder groups are pulse signals for the same reason as the case described with reference to FIG. 5A.

In addition, the L level mentioned above refers to the voltage obtained by dividing a voltage of the H level by N, similarly to the above case.

Consequently, the logic level of the 1st word line 77 selected by the decoder lines of the individual decoder groups changes from the ground level to the H level at the time point t1 and changes from the H level to the ground level at time point t2.

Further, in FIG. 5B, it is indicated that the amount of the consumption current 78 consumed by the row decoder circuit 7 at the time point t1 is "5−4/N", for the following reason. The row decoder circuit 7 consumes a current of "1" to change a signal of one of the decoder lines of the decoder group P0 from the ground level to the H level. Then, the row decoder circuit 7 consumes a current of "1−1/N" to change a signal of one of the decoder lines of the decoder group P1 from the L level, which is obtained by dividing the H level voltage by N, to the H level. In addition, the row decoder circuit 7 consumes a current of "(N−1)/N" to change the signals of the rest (N−1) decoder lines of the decoder group P1 from the L level to the ground level. Consumption current in the row decoder circuit 7 is similarly calculated for the decoder group P2. Thus, the amount of current that the row decoder circuit 7 consumes for the decoder group P2 can be obtained by adding "1−1/N" to "(N−1)/N". Therefore, the amount of current consumed by the row decoder circuit 7 for all of the decoder group P0, the decoder group P1, and the decoder group P2 is "5−4/N". FIG. 5B also indicates that the amount of the consumption current 78 consumed by the row decoder circuit 7 at the time point t2 is "1". This is because the row decoder circuit 7 consumes current in order to change the logic level of the signal 70 of the 0th decoder line of the decoder group P0 from the H level to the ground level. The logic levels of the signals of the decoder lines of the other decoder groups (i.e., P1 and P2) are changed to the L levels by the equalizing operation. Therefore, the row decoder circuit 7 does not consume current for the changes. Accordingly, the amount of the consumption current 78 consumed by the row decoder circuit 7 from the time point t1 to the time point t2 is "6−4/N".

As illustrated in FIG. 5B, the logic amplitude of signals of the decoder lines connected to the decoder group P1 (That is related to the decoder group 35 in FIG. 2.) and the decoder group P2 (That is related to the decoder group 36 in FIG. 2.) varies between the L level and the H level at the time point t1. Thus, the logic amplitude of these signals is relatively low. This indicates that a pulse rising period in a signal of a decoder line connected to the decoder group P0 (That is related to the decoder group 34 in FIG. 2.) can be shortened. Accordingly, the inter-pulse interval on the same decoder line can be shortened. As a result, a cycle time for activating a word line can be reduced, which permits high speed operations of the decoders. In the foregoing, the case is described with reference to FIGS. 5A and 5B in which an equalizing and floating circuits 56 are used in a semiconductor circuit. Such a semiconductor circuit has the following advantages.

As described with reference to FIGS. 4A and 4B, when no equalizing and floating circuits are used, the amount of current consumed by the row decoder circuit is "6". However, when the equalizing and floating circuits 56 are used, the amount of current consumed by the row decoder circuit 7 can be reduced.

The logic amplitude of the signals of the decoder lines illustrated in FIGS. 4A and 4B varies between the ground level and the H level. Thus, the logic amplitude is high. Therefore, it is difficult to reduce the interval of pulse signals transmitted through the same decoder line if no equalizing and floating circuits 56 are used. On the other hand, the logic amplitude of the signals of the decoder lines illustrated in FIGS. 5A and 5B is lower than that of the signals illustrated in FIGS. 4A and 4B. This indicates that the interval of pulse signals transmitted through the same decoder line can easily be reduced if the equalizing and floating circuits 56 are used. Accordingly, the use of the equalizing and floating circuits 56 allows increased operating speed of decoders.

What is claimed is:

1. A semiconductor memory device comprising:
a memory cell;
a word line connected to the memory cell;

a word driver circuit connected with the word line for driving the word line;

a plurality of decoder circuits for activating the word driver circuit, each of the decoder circuits outputting a decoder signal to a decoder line connected to each of the decoder circuits and the word driver circuit, and an equalizing circuit having a floating unit for setting the decoder line to a floating state with respect to the decoder circuit and an equalizing unit for equalizing the decoder lines that are connected to the same word driver.

2. A semiconductor memory device comprising:

a memory cell;

a word line connected to the memory cell;

a word driver circuit connected with the word line for driving the word line;

a plurality of first decoder circuits for activating the word driver circuit, each of the first decoder circuits outputting a first decoder signal to a first decoder line connected to each of the first decoder circuits and the word driver circuits;

a plurality of second decoder circuits outputting a second decoder signal for activating the word driver circuit, each of the second decoder circuit outputting a second decoder signal to a second decoder line connected to each of the second decoder circuit and the word driver circuit;

and an equalizing circuit having a floating unit for setting the second decoder line to a floating state with respect to the second decoder circuit and an equalizing unit for equalizing the second decoder lines that are connected to the same word driver.

3. The semiconductor memory device according to claim 2, wherein the first decoder signal is a pulse signal.

4. The semiconductor memory device according to claim 3, wherein:

the equalizing circuit operates after the first decoder signal is output to the word driver circuit, so as to perform equalizing the second decoder lines by the equalizing circuit.

5. The semiconductor memory device according to claim 4, further comprising:

a ground-potential source having a ground potential; and a high-potential source having a predetermined high potential, wherein the first decoder signal is at the ground potential when in a low-logic state and is at the predetermined high potential when in a high-logic state, and wherein the second decoder signal is at the ground potential or a potential obtained by dividing the predetermined high potential by a number of second decoder lines coupled by the equalizing circuit, when in the low-logic state, and is at the predetermined high potential, when in the high-logic state.

6. The semiconductor memory device according to claim 5, wherein the first decoder circuit outputs the first decoder signal to the first decoder line, when a first address signal is received from an external source, and wherein the second decoder circuit outputs the second decoder signal to the second decoder line, when a second address signal is received from the external source.

7. The semiconductor memory device according to claim 6, wherein the word driver circuit has an activation signal output unit for outputting an activation signal activating the word line; and wherein the activation signal output unit is connected to the first decoder line and the second decoder line and outputs the activation signal for activating the word line when the first decoder signal and the second decoder signal are in the high-logic state.

8. The semiconductor memory device according to claim 2, further comprising:

a control circuit for outputting a control signal to the first decoder circuit group, the second decoder circuit group, and the equalizing circuit, wherein the control circuit outputs the control signal in accordance with a clock signal received from an external source;

wherein the first decoder circuits output the first decoder signal in accordance with the control signal;

wherein the second decoder circuit output the second decoder signal in accordance with the control signal; and wherein when the floating unit set the floating state of the second decoder line in accordance with the control signal, the equalizing unit equalize the second decoder lines that are connected to the same word driver in accordance with the control signal.

9. The semiconductor memory device according to claim 2, further comprising:

an output circuit for outputting data read from the memory cells to an external source, wherein the output circuit outputs the data in accordance with the control signal.

10. A semiconductor memory device, comprising:

a memory cell;

a word line connected to the memory cell;

a word driver circuit connected with the word line for driving the word line;

a plurality of first decoder circuits for activating the word driver circuit, each of the first decoder circuits outputting a first decoder signal to a first decoder line connected to the word driver circuit;

a plurality of second decoder circuits for activating the word driver circuit, each of the second decoder circuits outputting a second decoder signal to a second decoder line connected to the word driver circuit;

and an equalizing circuit having a floating unit for setting the second decoder line to a floating state with respect to the second decoder circuit and an equalizing unit for equalizing the second decoder lines that are connected to the same word driver, wherein:

when the floating unit set the floating state of the second decoder line, the equalizing unit equalize the second decoder lines that are connected to the same word driver.

11. The semiconductor memory device according to claim 10, wherein:

the floating unit includes a first transfer gate composed of a P-type MOS transistor and an N-type MOS transistor, the first transfer gate being provided between the second decoder line and the second decoder circuit, the first transfer gate being connected to the second decoder line and the second decoder circuit, and wherein the equalizing unit includes a second transfer gate composed of a P-type MOS transistor and an N-type MOS transistor, the second transfer gate being provided between the second decoder lines and being connected the second decoder lines.

* * * * *